(12) United States Patent
Lin

(10) Patent No.: US 8,327,707 B2
(45) Date of Patent: *Dec. 11, 2012

(54) THERMAL BUBBLE TYPE ANGULAR ACCELEROMETER

(75) Inventor: Jium Ming Lin, Zhubei (TW)

(73) Assignee: Chung Hua University, Hsinchu (TW)

( * ) Notice: Subject to any disclaimer, the term of this patent is extended or adjusted under 35 U.S.C. 154(b) by 130 days.

This patent is subject to a terminal disclaimer.

(21) Appl. No.: 12/906,866

(22) Filed: Oct. 18, 2010

(65) Prior Publication Data

US 2011/0100123 A1   May 5, 2011

(30) Foreign Application Priority Data

Oct. 29, 2009 (TW) ................................. 98136612 A

(51) Int. Cl.
G01P 15/00 (2006.01)
C23F 1/00 (2006.01)

(52) U.S. Cl. ..................... 73/514.09; 73/514.05; 216/2

(58) Field of Classification Search ............... 73/514.01, 73/514.02, 514.05, 514.09
See application file for complete search history.

(56) References Cited

U.S. PATENT DOCUMENTS

| | | | | |
|---|---|---|---|---|
| 3,889,459 A * | 6/1975 | Lu | | 368/156 |
| 6,853,051 B2 * | 2/2005 | Shioga et al. | | 257/532 |
| 7,069,785 B2 * | 7/2006 | Chou | | 73/514.09 |
| 7,461,972 B2 * | 12/2008 | Cohen | | 374/100 |
| 2002/0029592 A1 * | 3/2002 | Yamazaki et al. | | 65/424 |
| 2005/0012513 A1 * | 1/2005 | Cheng et al. | | 324/754 |
| 2006/0169044 A1 * | 8/2006 | Hodgins et al. | | 73/514.34 |
| 2007/0101813 A1 * | 5/2007 | Hua et al. | | 73/514.16 |
| 2007/0102487 A1 * | 5/2007 | Suzuki et al. | | 228/101 |
| 2007/0182578 A1 * | 8/2007 | Smith | | 340/669 |
| 2008/0055045 A1 * | 3/2008 | Swan et al. | | 340/10.1 |
| 2008/0063576 A1 * | 3/2008 | Ichiki | | 422/186.04 |
| 2008/0072082 A1 | 3/2008 | Lertora et al. | | |
| 2008/0099144 A1 * | 5/2008 | Change et al. | | 156/345.11 |
| 2008/0204241 A1 * | 8/2008 | Di. Zettler | | 340/572.1 |
| 2008/0224315 A1 * | 9/2008 | Miyata et al. | | 257/750 |
| 2008/0269631 A1 * | 10/2008 | Denison et al. | | 600/544 |

FOREIGN PATENT DOCUMENTS

JP 2000-193677 7/2000

OTHER PUBLICATIONS

Singh et al., Silicon Germanium: Technology, Modeling, and Design, 2004, John Wiley & Sons, Inc., p. 59.*
English Machine Translation, Toshimi et al., JP 2000-193677, Jul. 14, 2000, Translated Jul. 2012.*
Japanese Office Action dated Jan. 18, 2012 issued by the Japanese Patent Office for related Application No. 200910212138.7 (plus Office Action Summary).

* cited by examiner

Primary Examiner — Hezron E Williams
Assistant Examiner — David Z Huang
(74) Attorney, Agent, or Firm — WPAT, P.C.; Anthony King

(57) ABSTRACT

An RFID, Bluetooth as well as zigbee based thermal bubble type angular accelerometer includes a flexible substrate, a base layer, at least one cavity, and at least one sensing assembly. The base layer is formed on the flexible substrate. The at least one cavity is formed on the base layer. The at least one sensing assembly is suspended over the at least one cavity. The sensing assembly comprises a heater and two temperature sensing elements, wherein the two temperature sensing elements are substantially symmetrically disposed on opposite sides of the heater, and the heaters and the two temperature sensing elements extend in a radial direction.

22 Claims, 19 Drawing Sheets

US 8,327,707 B2

THERMAL BUBBLE TYPE ANGULAR ACCELEROMETER

BACKGROUND OF THE INVENTION

1. Field of the Invention

The present invention relates to a thermal bubble type angular accelerometer, and relates more particularly to a thermal bubble type angular accelerometer that uses radio frequency identification, Bluetooth as well as zigbee technologies on the flexible substrate for communication and can be manufactured using low temperature processes.

2. Description of the Related Art

Small angular accelerometers based on different measuring principles have been developed to meet the requirements of measuring angular acceleration. One small angular accelerometer has an ingenious structure, such as a comb structure or a vibratory structure, formed using a semiconductor wafer. By measuring the change of parasitic capacitance or resonant frequency during the rotation of the microstructures, the angular velocity or the inclined angle of the microstructures can be calculated. However, these microstructures always deform when they are under the influence of force, resulting in fatigue and aging. Therefore, the angular accelerometer with such microstructures has a short lifespan.

Another type of angular accelerometer is configured to measure an inclination angle by detecting the movement of a thermal bubble. Such a thermal bubble accelerometer is usually built on a silicon wafer and uses a silicon dioxide layer to support the heaters and the thermistors of the angular accelerometer. Because silicon dioxide has low thermal conductivity (1.5 W/(m−K)), heat transfer in the accelerometers is adversely affected so that the temperature of the lower portion of a gas chamber is low, resulting in poor sensitivity of the thermistors. In addition, the poor heat transfer also affects the sensitivity of the thermistors in response to acceleration. Thus, in order to increase the sensitivity, traditional accelerometers need greater energy supply, increasing the working temperature in the accelerometers. However, under high working temperature, the silicon dioxide support for supporting the heaters and the thermistors may expand and shrink when the accelerometer is turned on and off, resulting in material fatigue and aging, reducing the lifespan of the accelerometer.

Furthermore, traditional accelerometers are filled with air or volatile liquids used as a thermally conductive medium. However, air contains oxygen, which may oxidize the heaters, and if volatile liquid is used, the volatile liquids may chemically react with the components in accelerometers, lowering their measurement accuracy after the accelerometers have been operated for a while, and reducing the lifespan of the accelerometers.

In summary, traditional angular accelerometers have short lifespans due to their easily aged microstructures, and require high temperature processes during manufacture, along with other shortcomings such as high cost, high energy consumption, material oxidation, aging, and low performance. Therefore, a new angular accelerometer is required.

SUMMARY OF THE INVENTION

The present invention proposes an RFID, Bluetooth as well as zigbee based thermal bubble type angular accelerometer. The thermal bubble type angular accelerometer is manufactured on a flexible substrate so as to reduce the manufacturing cost. Furthermore, the thermal bubble type angular accelerometer and an RFID, Bluetooth as well as zigbee antenna are integrally formed on the same substrate, facilitating convenient use.

One embodiment of the present invention provides a thermal bubble type angular accelerometer, which comprises a flexible substrate, a base layer, at least one first cavity, and at least one sensing assembly. The base layer is formed on the flexible substrate. The at least one first cavity is formed on the base layer. The at least one sensing assembly is suspended over the at least one first cavity. The at least one sensing assembly comprises a first heater and two first temperature sensing elements, wherein the two first temperature sensing elements are disposed substantially symmetrically on opposite sides of the first heater, and the first heater and the two first temperature sensing elements extend in a radial manner.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

The present invention discloses a thermal bubble type angular accelerometer. The thermal bubble type angular accelerometer is formed with the combination of the technique of manufacturing a thermal type angular accelerometer on a flexible substrate and the technique of radio frequency identification communication. Therefore, the thermal bubble type angular accelerometer of the present invention is convenient to use and can be manufactured at low cost.

One aspect of the present invention is that the support member of the thermal bubble type angular accelerometer of the present invention is manufactured of a material with high thermal conductivity such as aluminum nitride or silicon nitride. Particularly, aluminum nitride has thermal conductivity of 160 to 320 W/(m-K), close to that of copper, which has thermal conductivity of 400 W/(m-K). Comparatively, the support member of a traditional accelerometer is made of silicon dioxide having low thermal conductivity of 1.5 W/(m-K). Such low thermal conductivity causes the temperature of the lower portion of the gas chamber to be low, decreasing the sensitivity of thermal resistors to acceleration. In order to increase the sensitivity required to detect acceleration, the temperature of the gas chamber needs to be increased. Thus, more energy is consumed, and the heater in the accelerometer may undergo rapid wear due to thermal expansion and shrinkage caused when the accelerometer is turned on and off.

Another aspect of the present invention is that after a low pressure is induced into the sealed chamber in the angular accelerometer, a high molecular weight noble gas such as argon, krypton, and xenon is introduced into the chamber. As a result, the sensitivity of the angular accelerometer can be increased, and the oxidation and aging of heaters and thermal resistors can be avoided. In comparison, traditional accelerometers contain air or volatile liquids, which may oxidize heaters and thermal resistors, causing deterioration and reduced performance and lifespan of the heaters and thermal resistors.

A third aspect of the present invention is that a p-type amorphous silicon layer is formed from a mixed powder of p-type impurity and silicon using an e-gun evaporation process, and then the doped p-type amorphous silicon layer is annealed using a laser to obtain a doped p-type poly-silicon layer, which can be used as a thermistor or a resistor. No method of manufacturing a doped p-type poly-silicon layer on a flexible substrate at a low temperature has been previously proposed.

A fourth aspect of the present invention is that the thermal bubble type angular accelerometer can be in combination with a RFID, Bluetooth or zigbee wireless module on the flexible substrate for monitoring the angular acceleration.

Figure 1:
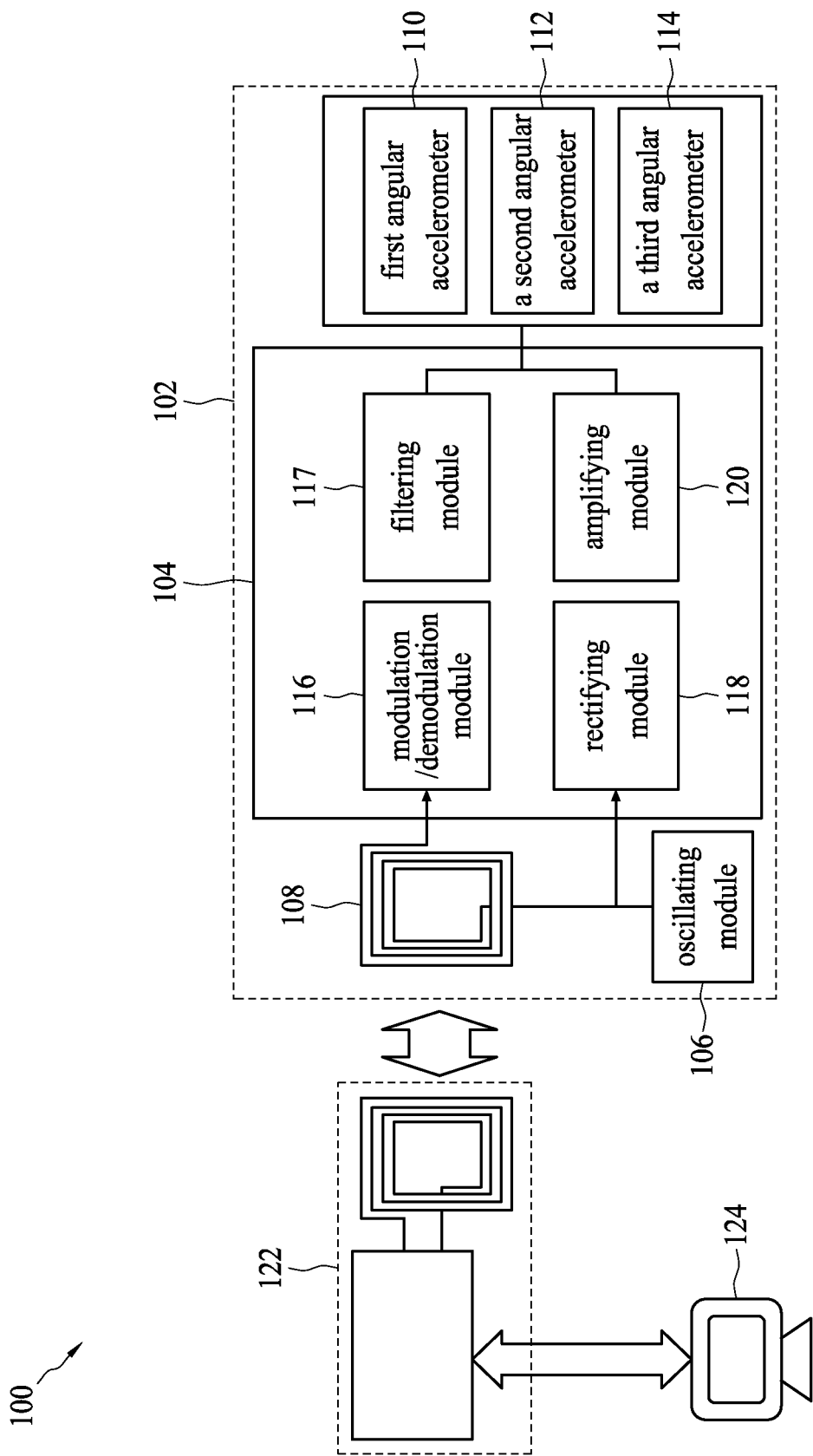
FIG. 1 is an illustrative view showing a system including an RFID based multi-axis thermal bubble type angular accelerometer according to one embodiment of the present invention.

FIG. 1 is an illustrative view showing a system 100 including an RFID based multi-axis thermal bubble type angular accelerometer 102 according to one embodiment of the present invention. The system 100 of the present invention includes a monitoring system 124, an RFID reader 122, and an RFID based multi-axis thermal bubble type angular accelerometer 102. The monitoring system 124 can be connected to the RFID reader 122, which uses radio frequency signals to communicate with the RFID based multi-axis thermal bubble type angular accelerometer 102. The RFID based multi-axis thermal bubble type angular accelerometer 102 may include an embedded system-on-chip unit 104, an oscillating module 106, an RFID antenna 108, a first angular accelerometer 110, a second angular accelerometer 112, and a third angular accelerometer 114. The embedded system-on-chip unit 104 includes a filtering module 117, a modulation/demodulation module 116, a rectifying module 118, and an amplifying module 120. The RFID antenna 108 is configured to receive radio frequency signals transmitted from an RFID reader 122, or to send radio frequency signals to the RFID reader 122. The RFID antenna 108 is coupled to the modulation/demodulation module 116, the rectifying module 118, and the oscillating module 106. In the present embodiment, the RFID antenna 108 is formed on a flexible substrate using microelectro-mechanical system technology.

The modulation/demodulation module 116 is configured to demodulate the radio frequency signals from the RFID reader 122, and to modulate the radio frequency signals to the RFID reader 122. The modulation process is performed by modulating signals on radio carrier waves so that the signals can be transmitted wirelessly.

The rectifying module 118 is configured to produce direct current using the radio frequency signals received by the RFID antenna 108. When the multiple-axis thermal bubble type angular accelerometer 102 is set to a passive mode, the multiple-axis thermal bubble type angular accelerometer 102 is driven by the direct current generated by the rectifying module 118 receiving radio frequency signals. Generally, to conserve power, the working mode is switched to the passive mode from an active mode while no radio frequency signal is being transmitted. The multiple-axis thermal bubble type angular accelerometer 102 is activated when radio frequency signals from the RFID reader 122 are received. If weak signals are received and radio frequency signals are to be transmitted to the RFID reader 122, the active mode is selected. Otherwise, the radio frequency signals are transmitted back to the RFID reader 122 in the passive mode.

The amplifying module 120 is configured to amplify electrical signals generated by the first angular accelerometer 110, the second angular accelerometer 112, and the third angular accelerometer 114. In the present embodiment, the amplifying module 120 may be composed of a plurality of instrumentation amplifiers. The instrumentation amplifier is a conventional precise amplifier, and therefore detailed descriptions are not presented here.

The filtering module 117 can be coupled to the first angular accelerometer 110, the second angular accelerometer 112, and the third angular accelerometer 114. The filtering module 117 is configured to remove DC bias for obtaining the angle variation in a short time. In the present invention, the filtering module 117 can be a high pass filter.

The oscillating module 106 is configured to provide the embedded SOC unit 104 with a clock signal so as to drive the embedded SOC unit 104. The RFID based multi-axis thermal bubble type angular accelerometer 102 may additionally comprise a plurality of thin film resistors and a plurality of thin film capacitors, wherein the plurality of thin film resistors can be coupled to the amplifying module 120, thereby providing precise resistors to the amplifying module 120. Alternatively, the plurality of thin film resistors can be coupled with some components so as to serve as different filters for filtering noises to obtain angular acceleration signals.

The z-axis angular accelerometer 110, the x-axis angular accelerometer 112, and the y-axis angular accelerometer 114 can be coupled to the embedded system-on-chip unit 104. Accordingly, the z-axis angular accelerometer 110, the x-axis angular accelerometer 112, and the y-axis angular accelerometer 114 can allow the embedded system-on-chip unit 104 to separately acquire z-, x-, and y-axis angular acceleration measurements. By combining functions of the z-axis angular accelerometer 110, the x-axis angular accelerometer 112, the y-axis angular accelerometer 114, the RFID antenna 108, and the modulation/demodulation module 116, the angular acceleration signals generated from the RFID based multi-axis thermal bubble type angular accelerometer 102 can be transmitted to the RFID reader 122 by wireless transmission so that an angular acceleration monitoring system 124 may obtain the angular acceleration signals from the RFID based multi-axis thermal bubble type angular accelerometer 102 via the RFID reader 122 and send the angular acceleration signals to a monitoring center.

Figure 2:
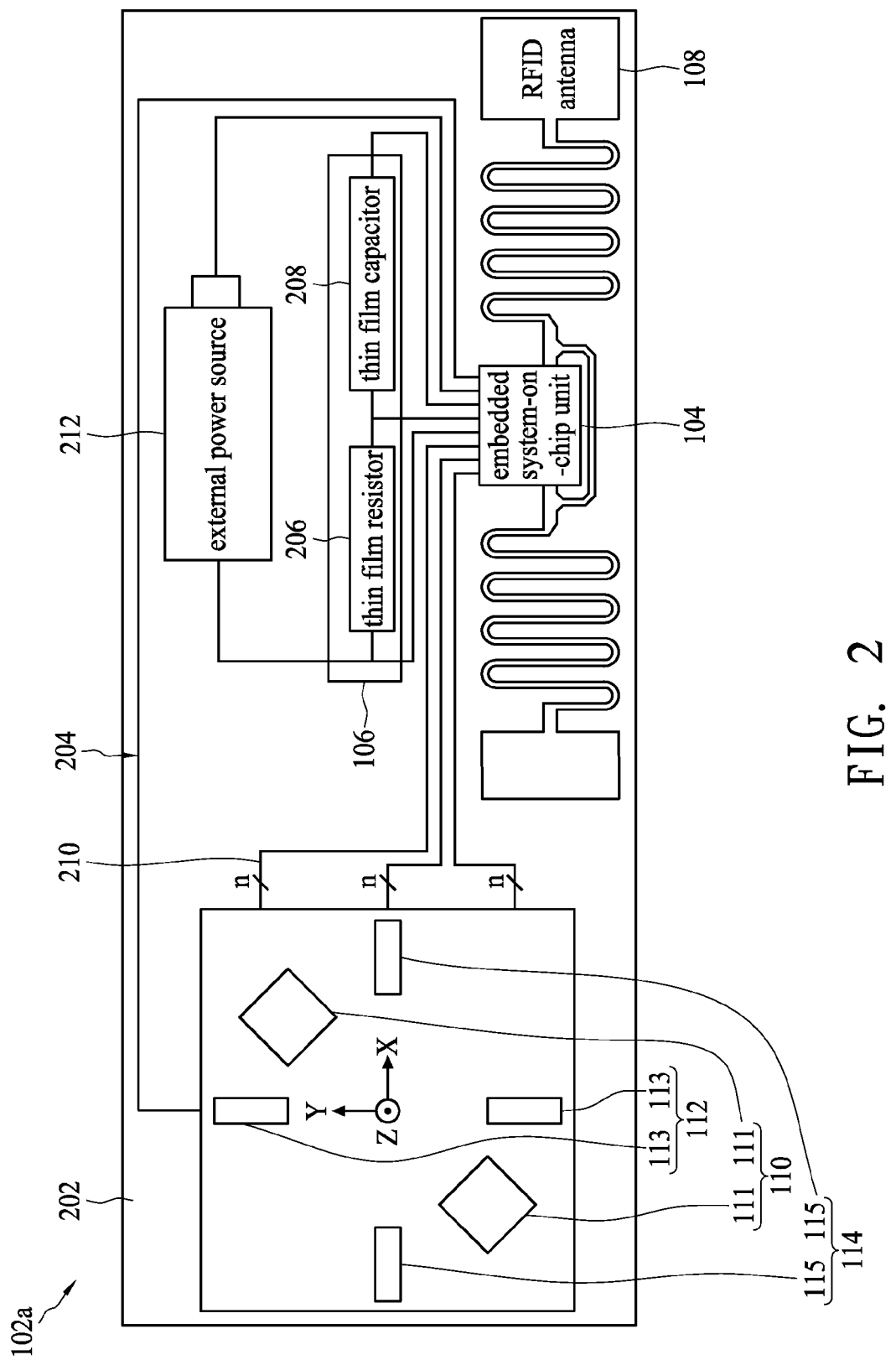
FIG. 2 is an illustrative view showing an RFID based multi-axis thermal bubble type angular accelerometer according to one embodiment of the present invention.

FIG. 2 is an illustrative view showing an RFID based multi-axis thermal bubble type angular accelerometer 102a according to one embodiment of the present invention. Referring to FIGS. 1 and 2, on a flexible substrate 202, an RFID antenna 108, a circuit 204 including an oscillating module 106, a z-axis angular accelerometer 110, an x-axis angular accelerometer 112, and a y-axis angular accelerometer 114 can be formed using the micro-electro-mechanical system technology, wherein the z-axis angular accelerometer 110 comprises a plurality of sensing assemblies 111, the x-axis angular accelerometer 112 comprises a plurality of sensing assemblies 113, and the y-axis angular accelerometer 114 comprises a plurality of sensing assemblies 115. The oscillating module 106 comprises at least one thin film resistor 206 and at least one thin film capacitor 208. The circuit 204 comprises a plurality of sets of signal traces 210 respectively coupling the z-axis angular accelerometer 110, the x-axis angular accelerometer 112, and the y-axis angular accelerometer 114 to the embedded system-on-chip unit 104. Each set of signal traces 210 includes a positive signal trace, a negative signal trace, and a ground trace. On the flexible substrate 202, a connection mechanism for connecting an external power source 212, for example a battery, can be further provided so that when the multi-axis thermal bubble type angular accelerometer 102a operates in an active mode, the power supply is sufficient for such an operation.

In the present embodiment, the plurality of sensing assemblies 111 of the z-axis angular accelerometer 110 are disposed on the flexible substrate 202 and symmetrically relative to the z-axis perpendicular to the x-axis and y-axis so that when the flexible substrate 202 rotates around the z-axis, the angular acceleration can be measured. The plurality of sensing assemblies 113 of the x-axis angular accelerometer 112 are disposed symmetrically to the x-axis parallel to the surface of the flexible substrate 202, thereby measuring the angular acceleration of the flexible substrate 202 about the x-axis. The plurality of sensing assemblies 115 of the y-axis angular accelerometer 114 are disposed symmetrically to the y-axis parallel to the surface of the flexible substrate 202, thereby measuring the angular acceleration of the flexible substrate 202 about the y-axis. Although the present embodiment demonstrates three angular accelerometers on the flexible substrate 202, the present invention is not limited to such a configuration. Other embodiments such as a single thermal bubble type angular accelerometer formed on a flexible substrate 202 or two angular accelerometers for measuring the angular accelerations of two different axes are included in the present invention.

Figure 3:
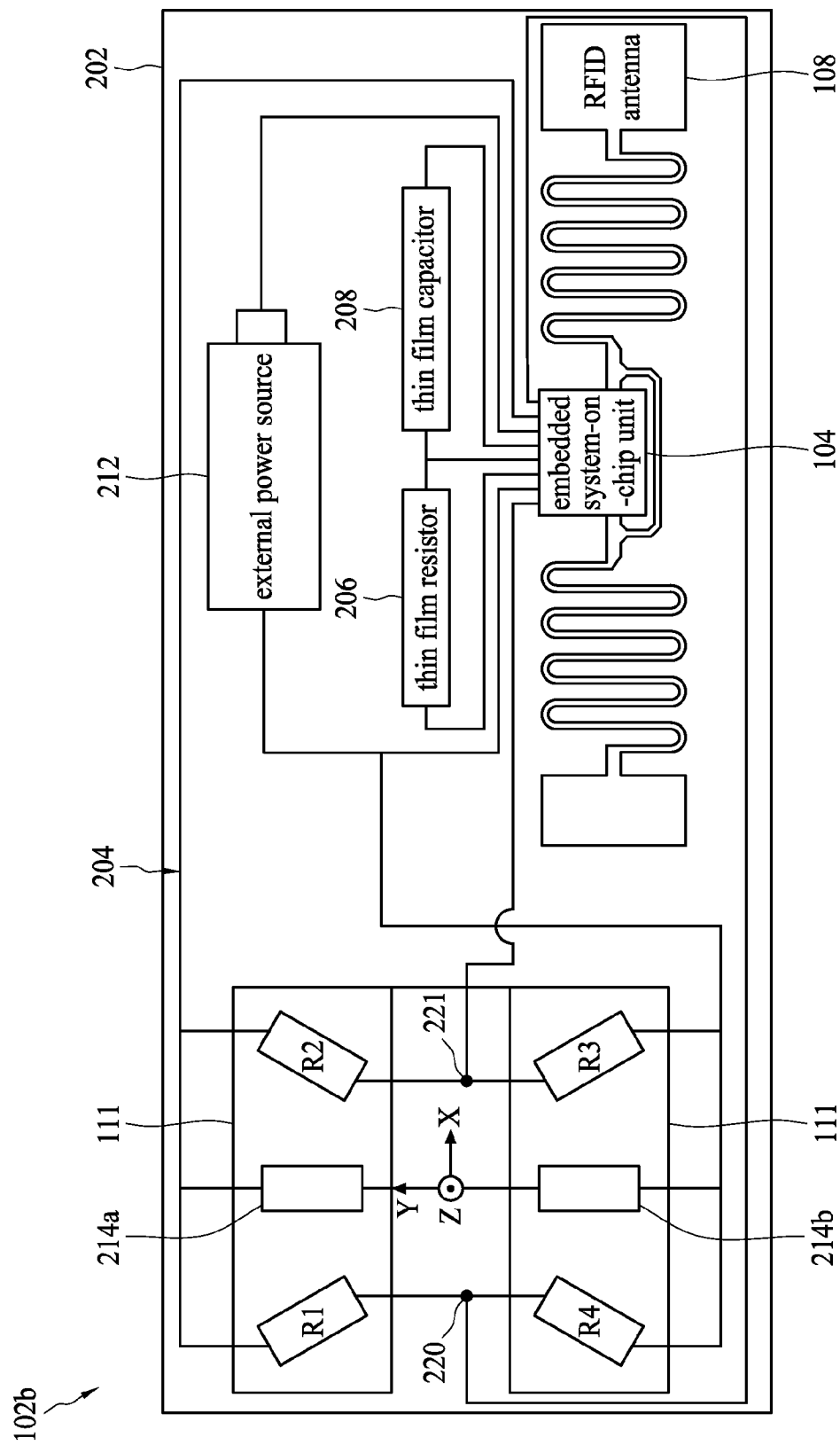
FIG. 3 is an illustrative view showing a z-axis thermal bubble type angular accelerometer according to one embodiment of the present invention.
Figure 4:
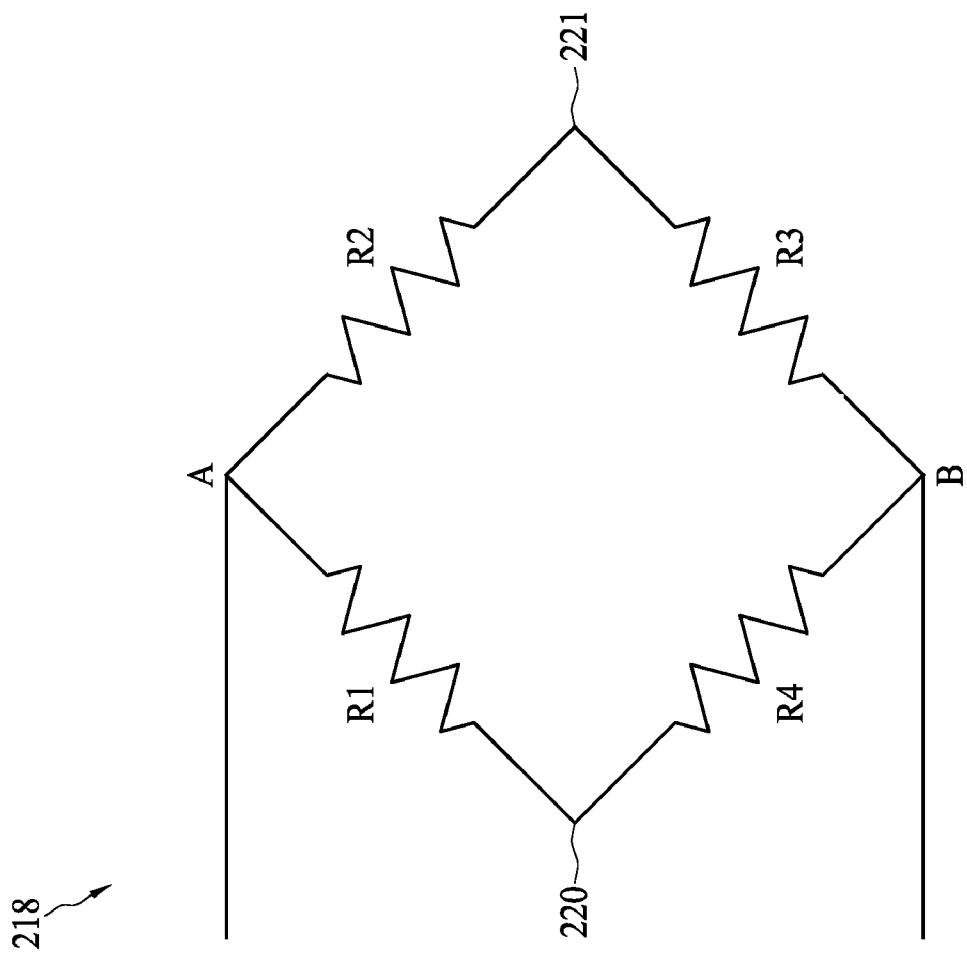
FIG. 4 demonstrates an equivalent circuit model for the electrical circuit formed by four temperature-sensing elements according to one embodiment of the present invention.

Referring to FIGS. 2 to 4, the thermal bubble type angular accelerometer 102b may comprise a plurality of sensing assemblies 111 surrounding and disposed substantially equidistant from the z-axis perpendicular to the drawing sheet. Each sensing assembly 111 includes a heater (214a or 214b) and two temperature sensing elements ((R1, R2) or (R3, R4)), wherein the heater (214a or 214b) and the temperature sensing elements ((R1, R2) or (R3, R4)) are configured to surround the z-axis, substantially equidistant from the z-axis, and extend radially relative to the z-axis. The temperature-sensing elements (R1, R2, R3, and R4) can be connected according to the following exemplary description. The temperature-sensing elements (R1 and R2) and the temperature-sensing elements (R3 and R4) are respectively connected at connections A and B connecting to a chip unit for power supplying. The temperature-sensing elements (R1 and R2) and the temperature-sensing elements (R3 and R4) between the sensing assemblies 111 are connected in a manner such that in a direction of rotation about the z-axis, the temperature-sensing element, located upwind, in one sensing assembly is serially connected to the temperature-sensing element, located downwind, in another sensing assembly. For example, in the counter-clockwise direction of rotation about the z-axis, the upwind temperature-sensing element R1 is serially connected to the downwind temperature-sensing element R4, and an electrical detection test point 220 is formed between them; and the upwind temperature-sensing element R3 is serially connected to the downwind temperature-sensing element R2, and an electrical detection test point 221 is formed between them. As a result, a double difference Wheatstone bridge 218 as shown in FIG. 4 can be obtained.

When the sensing assemblies 111 rotate about the z-axis, the resistance of the upwind temperature-sensing elements (R1, R3) may change due to engagement with higher temperature environmental gas. As a result, a differential output voltage between the electrical detection test points 220 and 221 of the double difference Wheatstone bridge 218 may be generated. By measuring the differential output voltage, the z-axis angular acceleration can be determined, and the angular velocity and the rotational angle can be calculated by integration. Because the variation of the resistance is proportional to the angular acceleration, the thermal bubble type angular accelerometer 102b can be applied for measuring angular acceleration.

Figure 5:
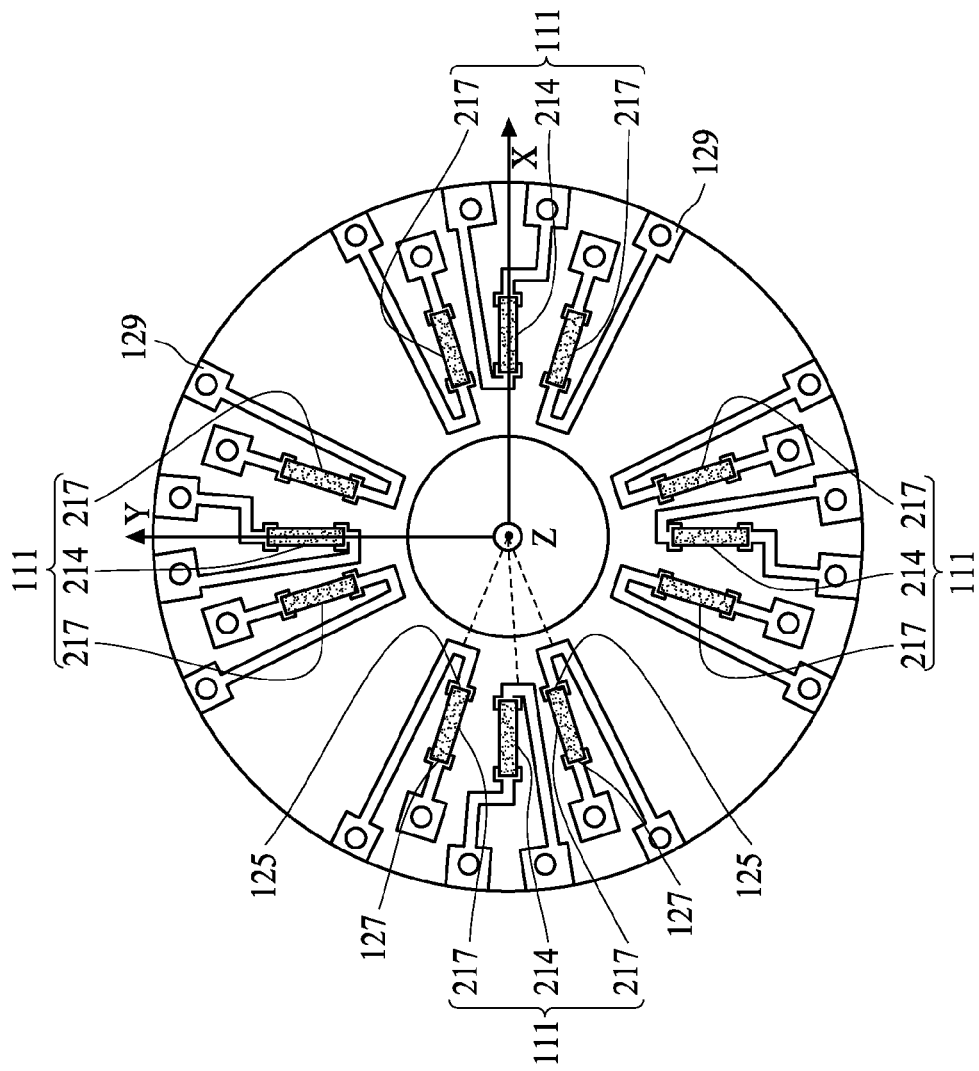
FIG. 5 is a view showing a layout of a z-axis thermal bubble type angular accelerometer according to one embodiment of the present invention.

Referring to FIG. 5, the plurality of sensing assemblies 111 are disposed on the X-Y plane perpendicular to the z-axis. The plurality of heaters 214 and the plurality of temperature sensing elements 217 are disposed to surround the z-axis and be equally separated from the z-axis, and configured to extend in a radial manner. In other words, using the sensing assembly 111 as an example, the temperature sensing element 217 includes two ends 125 and 127 for connecting externally, and the temperature sensing elements 217 are symmetrically disposed relative to the heater 214 so that the heater 214 and the temperature sensing elements 217 can extend through an origin point of intersection as shown in FIG. 5. In the present embodiment, the point of intersection can be on the z-axis. The peripheral area of the sensing assemblies 111 can be provided with a plurality of contact pads 129, and the ends 125 and 127 of the heaters 214 and the temperature sensing elements 217 can electrically connect to the contact pads 129 in a corresponding manner.

Figure 6:
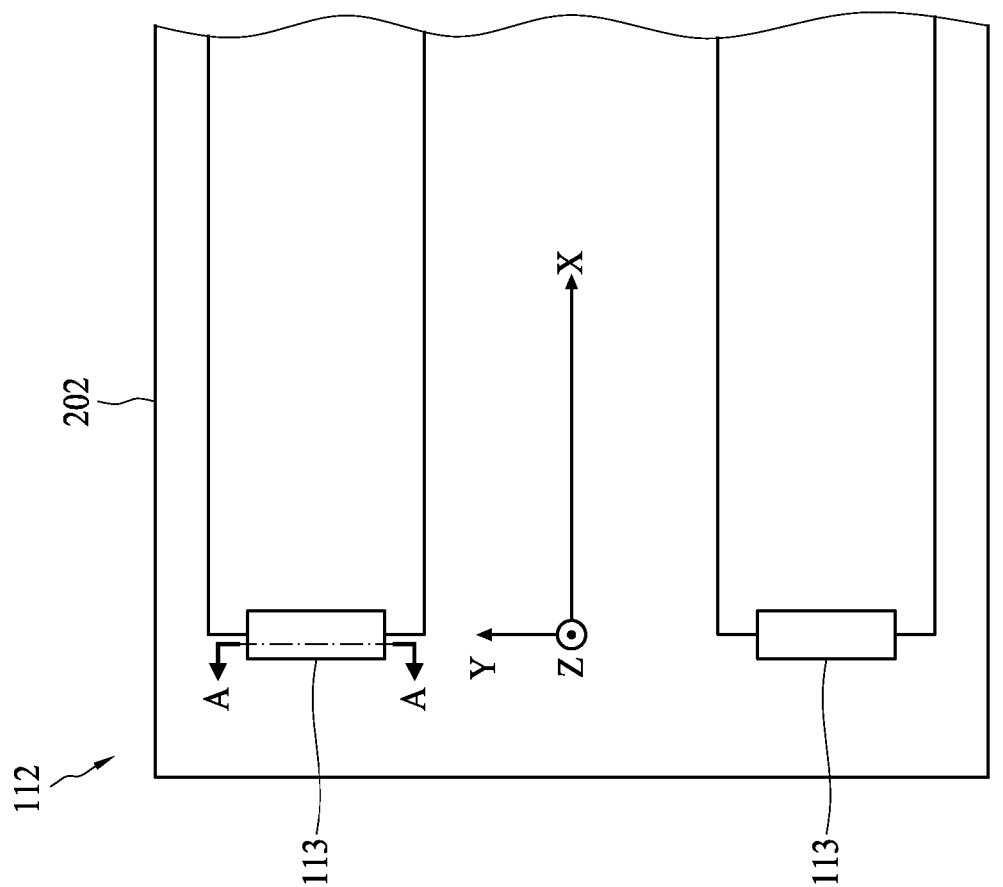
FIG. 6 is an illustrative view showing an x-axis thermal bubble type angular accelerometer according to one embodiment of the present invention.
Figure 7:
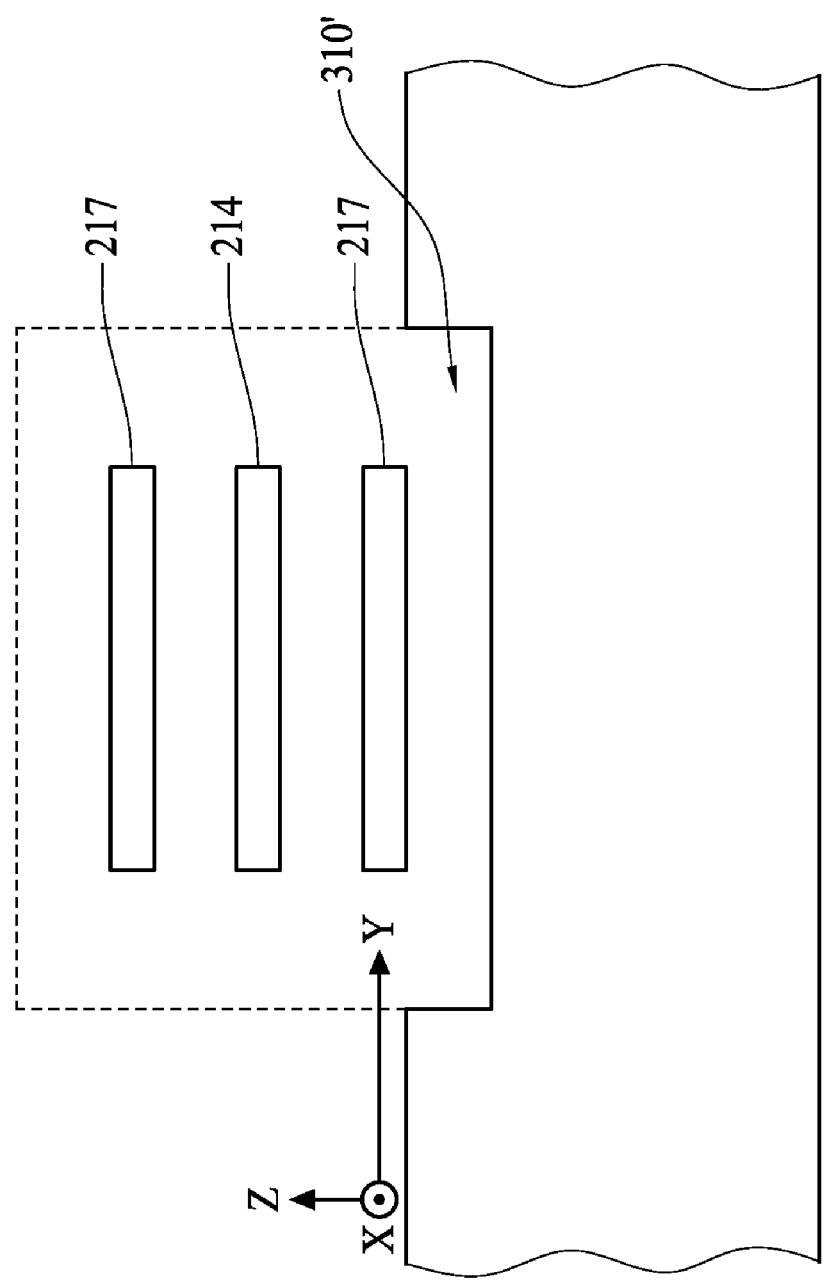
FIG. 7 is a cross-sectional view along line A-A of FIG. 6.

Referring to FIGS. 6 and 7, the plurality of sensing assemblies 113 can be substantially symmetrically disposed relative to the x-axis and on the flexible substrate 202, wherein each sensing assembly 113 may be, but is not necessarily, elongated in a direction perpendicular to the x-axis. Each sensing assembly 113 can be suspended over a cavity 310' and includes a heater 214 and two temperature sensing elements 217. The heater 214 and the two temperature sensing elements 217 are arranged along a direction parallel to the z-axis, wherein the two temperature sensing elements 217 are disposed symmetrically relative to the heater 214. The temperature sensing elements 217 of two oppositely-disposed sensing assemblies 113 can be connected to form a double difference Wheatstone bridge as mentioned above. From the electrical detection test points, the differential output voltage produced by the rotation about the x-axis can be obtained. Similarly, relative to the y-axis, a plurality of sensing assemblies can be disposed for measuring the angular acceleration about the y-axis in a manner similar to that shown in the embodiment of FIG. 6, wherein the heaters of the plurality of sensing assemblies are disposed symmetrically relative to the y-axis, and the temperature sensing elements of the plurality of sensing assemblies are disposed symmetrically relative to the y-axis, and the heater and the temperature sensing elements in a sensing assembly are disposed in a stacking manner. The heaters and the temperature sensing elements of the sensing assemblies can be elongated in a direction perpendicular to the y-axis.

Figure 8:
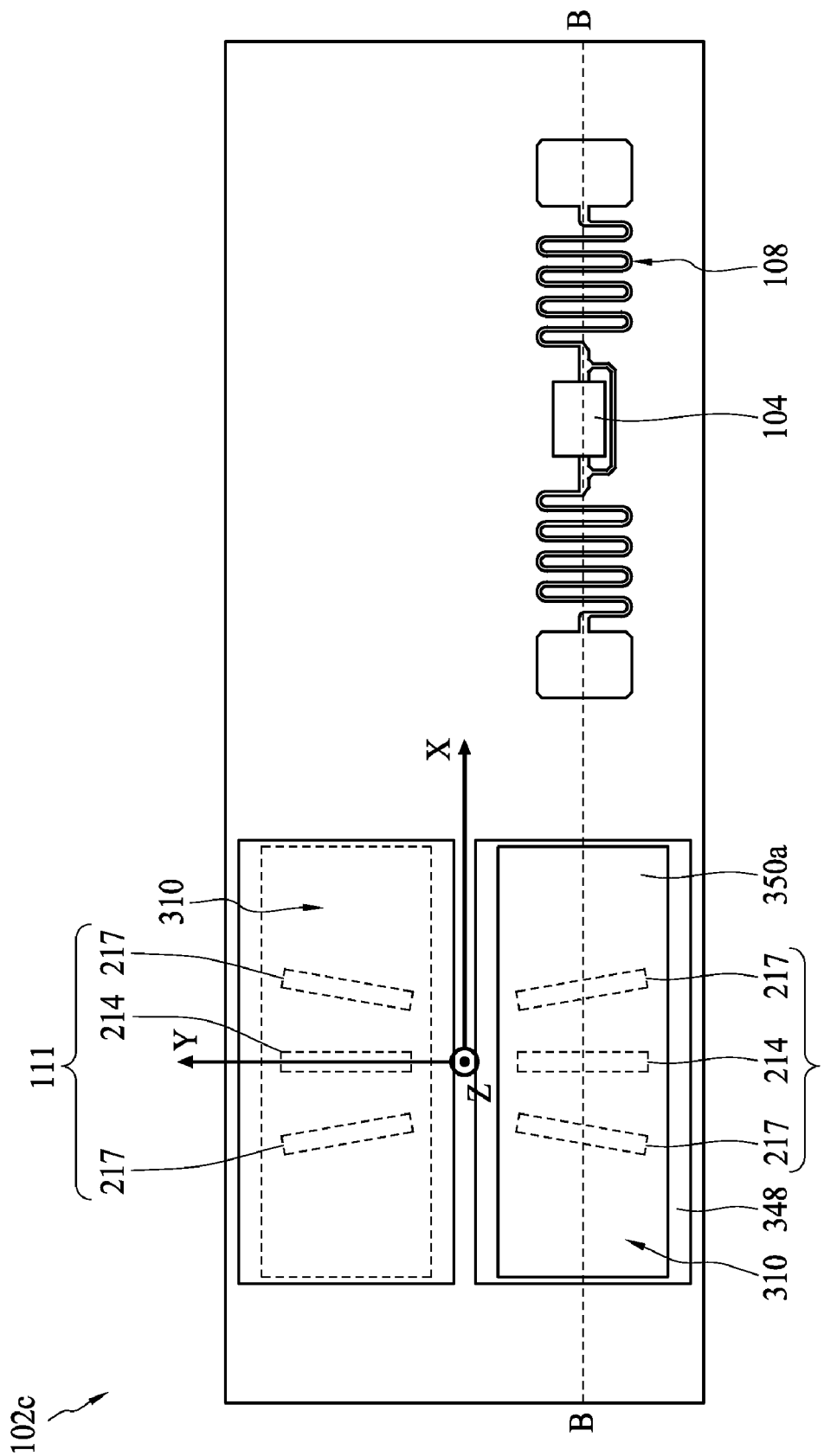
FIG. 8 is a top view showing a z-axis thermal bubble type angular accelerometer formed on a flexible substrate and having two rectangular covers according to one embodiment of the present invention.
Figure 9:
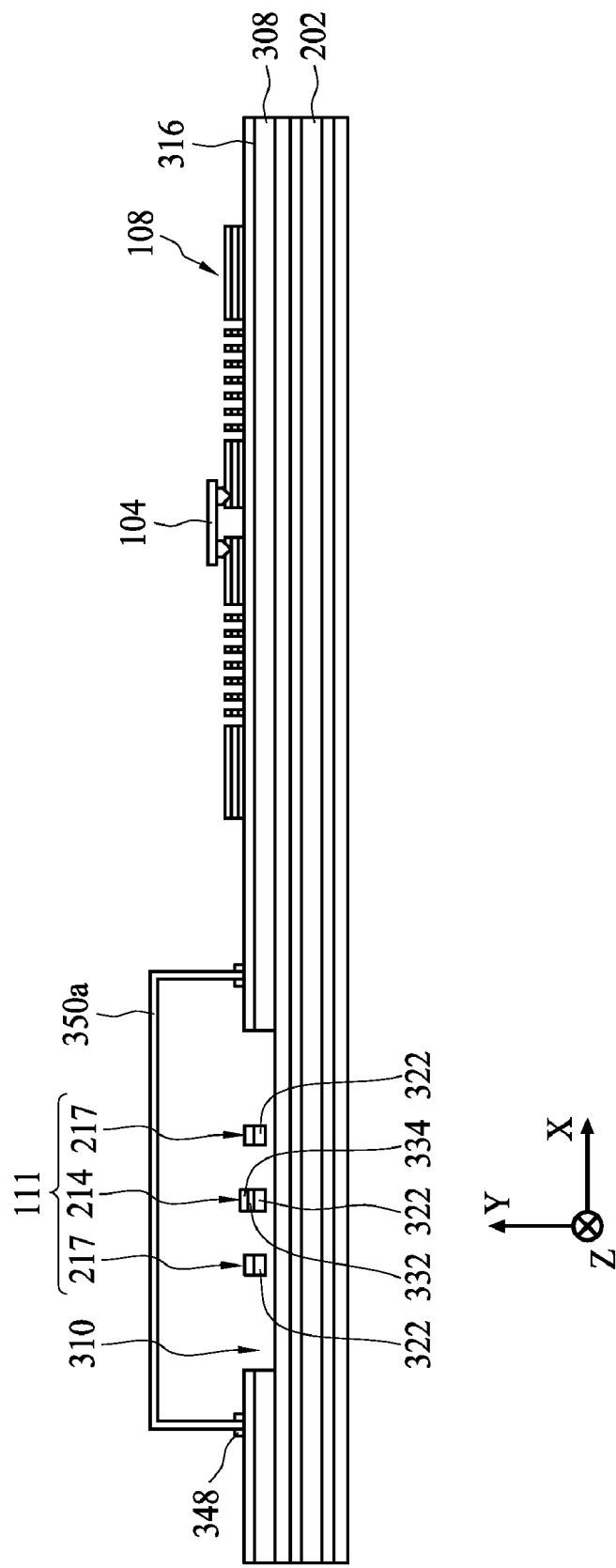
FIG. 9 is a cross-sectional view along line B-B of FIG. 8.

Referring to FIGS. 8 and 9, the z-axis thermal bubble type angular accelerometer 102c can be manufactured using the method disclosed in Taiwan Patent Application No. 098127348. The manufacturing method has already been described and is not reiterated here. The thermal bubble type angular accelerometer 102c may include a flexible substrate 202, a base layer 308, a plurality of cavities 310, and a plurality of sensing assemblies 111. The base layer 308 is disposed on the flexible substrate 202, including a surface 316. The plurality of cavities 310 are disposed on the surface 316 of the base layer 308, and surround the z-axis. The plurality of sensing assemblies 111 are suspended over the respective cavities 310 and are substantially equally spaced along the x-axis. The substantially equal distance may be measured from a corresponding location on the plurality of sensing assemblies 111 to the z-axis, and the corresponding location may be, for example, one end portions or the central points of the heaters 214 and the temperature sensing elements 217.

Each sensing assembly 111 includes a heater 214 and two temperature sensing elements 217. Each of the heater 214 and the temperature sensing elements 217 is suspended over the respective cavity 310 using a support member 322, wherein the support member 322 is configure to span over the cavity 310 and includes aluminum nitride or silicon nitride. Because aluminum nitride has thermal conductivity of 160 to 320 W/(m–K), which is close to that of copper having thermal conductivity of 400 W/(m–K), the temperature of the lower portion of the gas chamber of the thermal bubble type angular accelerometer 102c can be increased, and the sensitivity of the temperature sensing elements 217 may be improved. In another embodiment, because hydrofluoric acid buffer solution does not etch silicon nitride and can be easily applied in processes, silicon nitride can be used to replace the aluminum nitride for supporting the heaters 214 and the temperature-sensing elements 217. However, silicon nitride has a thermal conductivity coefficient (about 35 W/(m–K)) that is lower than that of aluminum nitride (about 160 to 320 W/(m–K)), but higher than that of the traditionally used silicon dioxide (about 1.5 W/(m–K)).

A cover 350a is disposed over the respective cavity 310, covering the heaters 214 and the temperature-sensing elements 217. The cover 350a can be sealed using an adhesive 348 in an airtight manner. The adhesive 348 can be provided using a screen-printing method. After the adhesive 348 is dried and a low pressure is induced into the cavity 310, a high molecular weight noble gas such as argon, krypton or xenon is then introduced for increasing the sensitivity of the angular accelerometer 102c and avoidance of oxidation and deterioration of the heaters 214 as well as the temperature sensing elements 217.

In particular, the temperature sensing element 217 may include a doped p-type poly-silicon layer, which is formed by annealing a p-type amorphous silicon layer obtained from depositing a mixed powder of p-type impurity and silicon using an e-gun evaporation process. The doped p-type poly-silicon layer can be used to manufacture thermistors 324 or resistors. The method can be used to manufacture a doped p-type poly-silicon layer 324 on a flexible substrate at a low temperature and has not been previously proposed. The temperature sensing element 217 may have an outline configuration such as a straight shape, or a zigzag shape.

The heater 214 may include a chrome layer 332 and a nickel layer 334, wherein the chrome layer 332 and the nickel layer 334 can be vapor-deposited using an e-gun. The heater 214 can have an outline configuration such as a straight shape, or a zigzag shape.

Referring to FIGS. 8 and 9 again, the thermal bubble type angular accelerometer 102c may further comprise an RFID antenna 108, an embedded system-on-chip unit 104, and a circuit (not shown). The RFID antenna 108 is formed on the flexible substrate 202. The embedded system-on-chip unit 104 is disposed on the flexible substrate 202, connecting to the RFID antenna 108. The circuit is formed on the flexible substrate 202 for electrically interconnecting components in the thermal bubble type angular accelerometer 102c and for adjusting the performance of the components. The circuit may include a plurality of conductive traces and bonding pads. The RFID antenna 108 and the circuit may separately comprise a gold layer, a chrome layer, and a nickel layer, wherein the chrome layer and the nickel layer can be formed using an e-gun evaporation process, and the gold layer can be formed on the nickel layer by an electroless plating process. Due to its good adhesion property and low resistivity, gold is a suitable material for the RFID antenna 108, the conductive traces, and the pads. The embedded system-on-chip unit 104 can be flip-chip bonded onto the feeding terminals of RFID antenna 108 using a thermal compression method.

Figure 10:
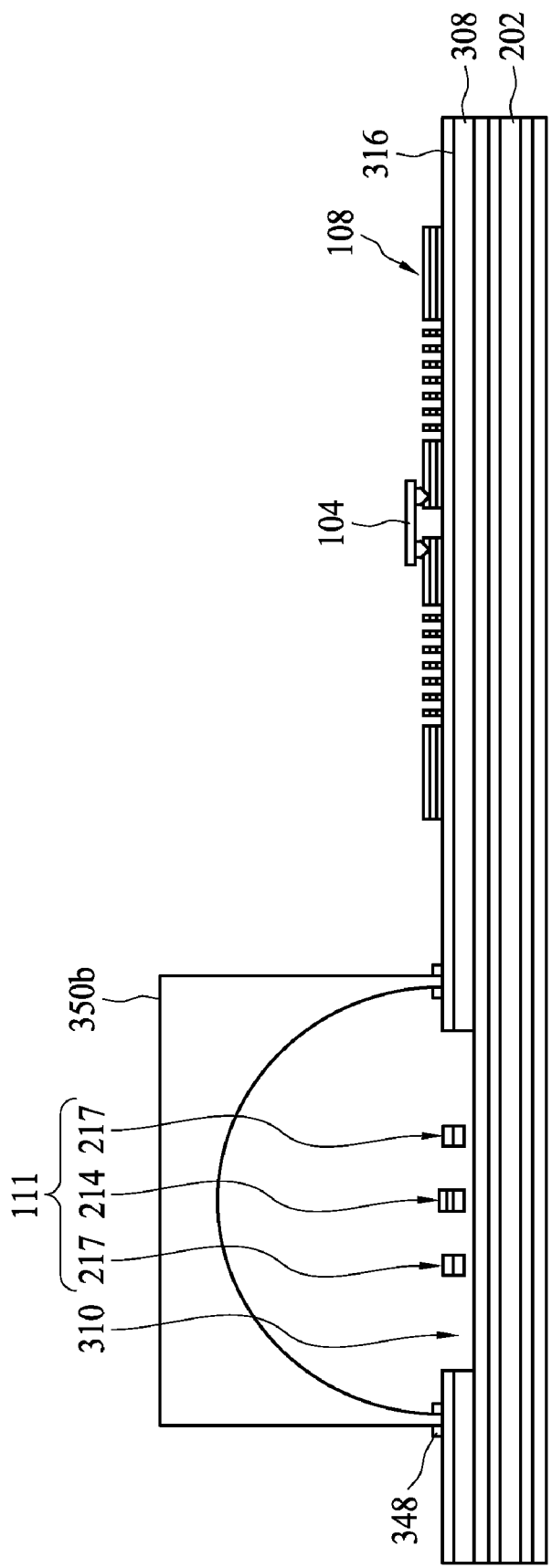
FIG. 10 is a cross-sectional view showing a z-axis thermal bubble type angular accelerometer formed on a flexible substrate and having a rectangular cover with a hemi-cylindrical or hemi-spherical interior according to one embodiment of the present invention.

Referring to FIG. 10, in another embodiment, the sensing assembly 111 can be sealed with a cover 350b having a hemi-cylindrical or hemi-spherical interior, which may facilitate the temperature distribution and facilitate the sensing assembly 111 to quickly reach a steady state temperature without causing turbulent flow. As a result, the response time, accuracy of angular acceleration measurement, linearity, and range of the measurement of the angular accelerometer 102c can be improved. The cover 350b has to have a rectangular planar surface, on which a trademark, a product name, a production serial number, and a production date can be easily printed.

Figure 11:
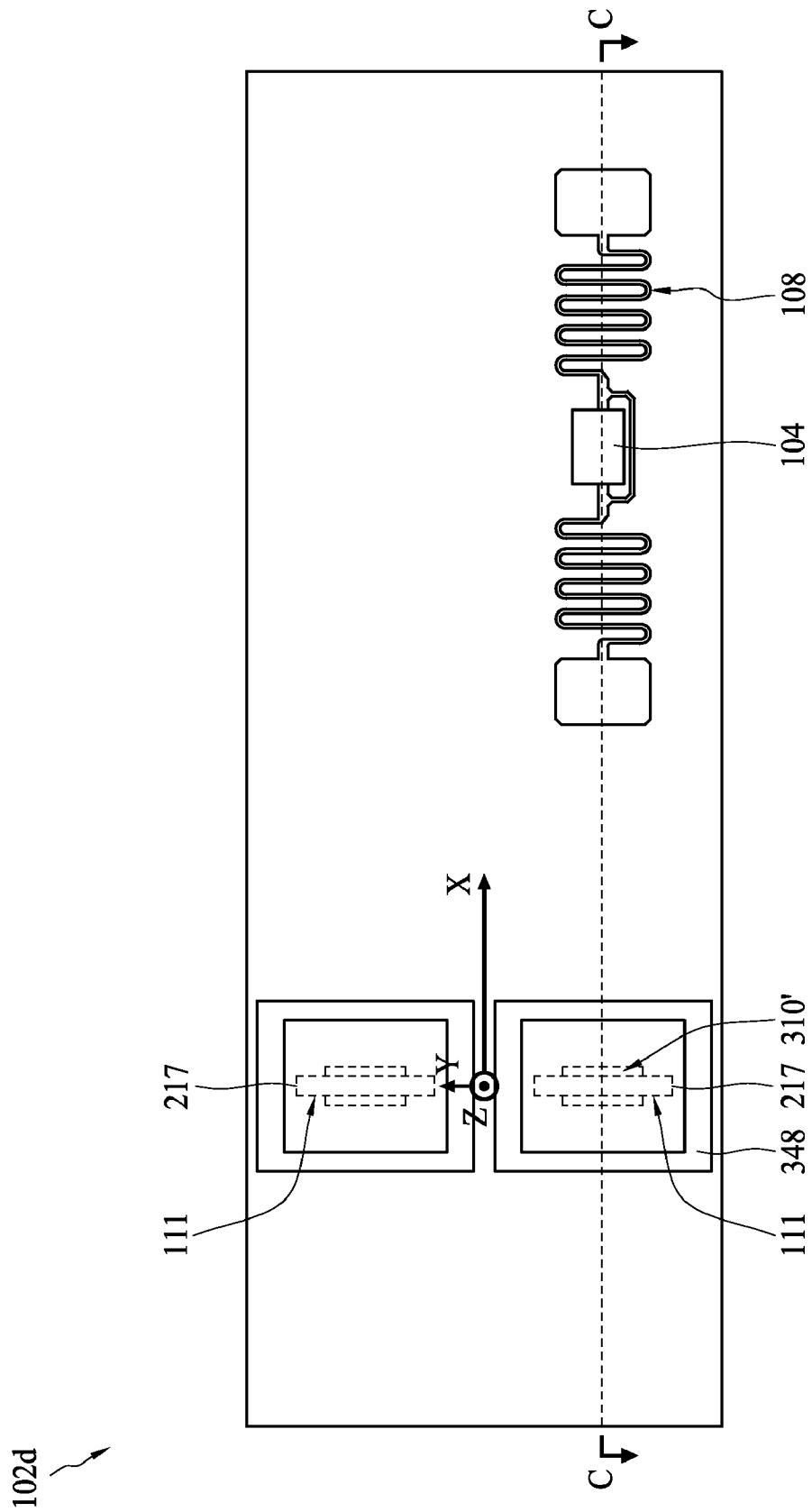
FIG. 11 is a cross-sectional view showing an x-axis thermal bubble type angular accelerometer formed on a flexible substrate and having two rectangular covers with a hemi-cylindrical interior according to one embodiment of the present invention.
Figure 12:
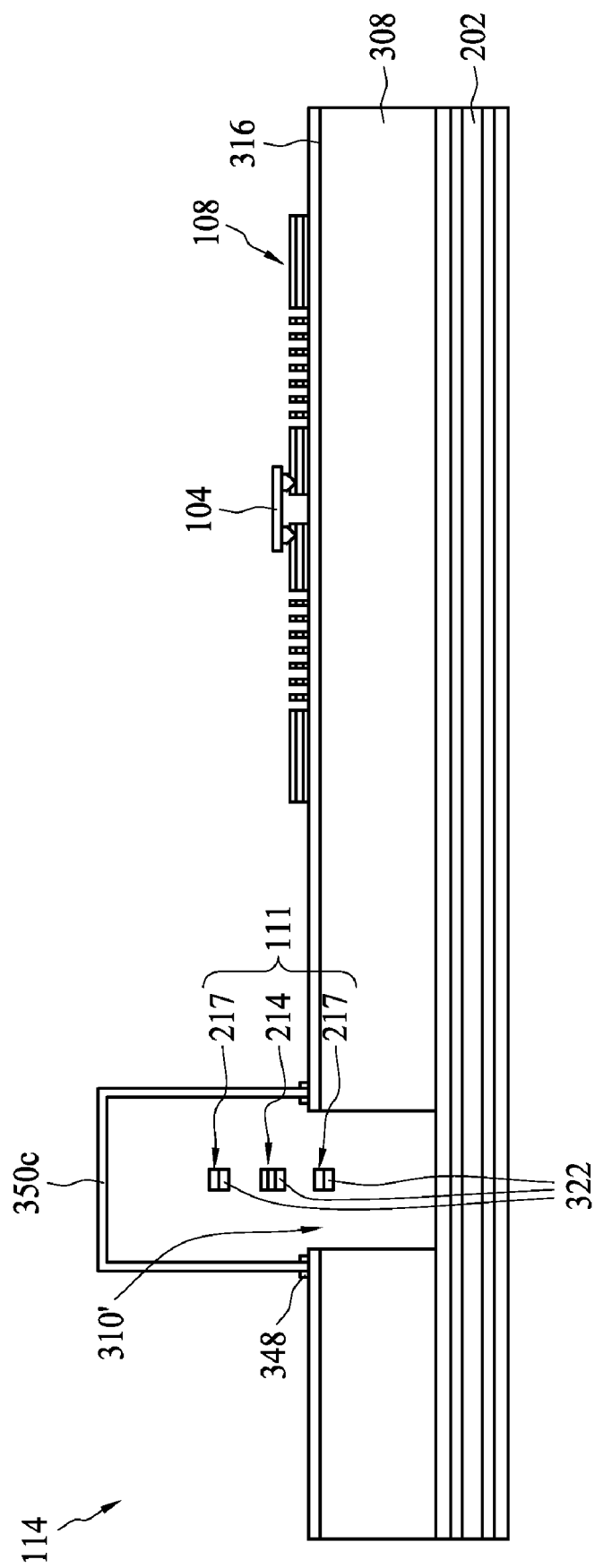
FIG. 12 is a cross-sectional view along line C-C of FIG. 11.

Referring to FIGS. 11 and 12, another embodiment of the present invention proposes a thermal bubble type angular accelerometer 102d, which includes a flexible substrate 202, a base layer 308, a plurality of cavities 310', and a plurality of sensing assemblies 111. The base layer 308 is disposed on the flexible substrate 202, including a surface 316. The plurality of cavities 310' are disposed on the surface 316 of the base layer 308, and are located on opposite sides relative to the x-axis parallel to the surface 316. The plurality of sensing assemblies 111 are suspended over the respective cavities 310' and are arranged in a symmetrical manner relative to the x-axis. Each sensing assembly 111 includes a heater 214 and two temperature sensing elements 217 disposed on opposite sides of the heater 214. The heater 214 and the two temperature sensing elements 217 are disposed along the z-axis in a stacking manner. Each of the heater 214 and the temperature sensing elements 217 is suspended over the respective cavity 310' using a support member 322, wherein the support member 322 is configure to span over the cavity 310' and includes aluminum nitride or silicon nitride. A cover 350c is disposed over the respective cavity 310', covering the heaters 214 and the temperature-sensing elements 217. The cover 350c can be sealed using an adhesive 348 in an airtight manner. A high molecular weight noble gas such as argon, krypton or xenon is introduced into the cavity 310'.

Referring to FIGS. 11 and 12, the thermal bubble type angular accelerometer 102d may further comprise an RFID antenna 108, an embedded system-on-chip unit 104, and a circuit (not shown). The RFID antenna 108 is formed on the flexible substrate 202. The embedded system-on-chip unit 104 is disposed on the flexible substrate 202, connecting to the RFID antenna 108. The circuit is formed on the flexible substrate 202 for electrically interconnecting components in the thermal bubble type angular accelerometer 102d and for adjusting the performance of the angular accelerometer and the other components. The circuit may include a plurality of conductive traces and bonding pads.

Figure 13:
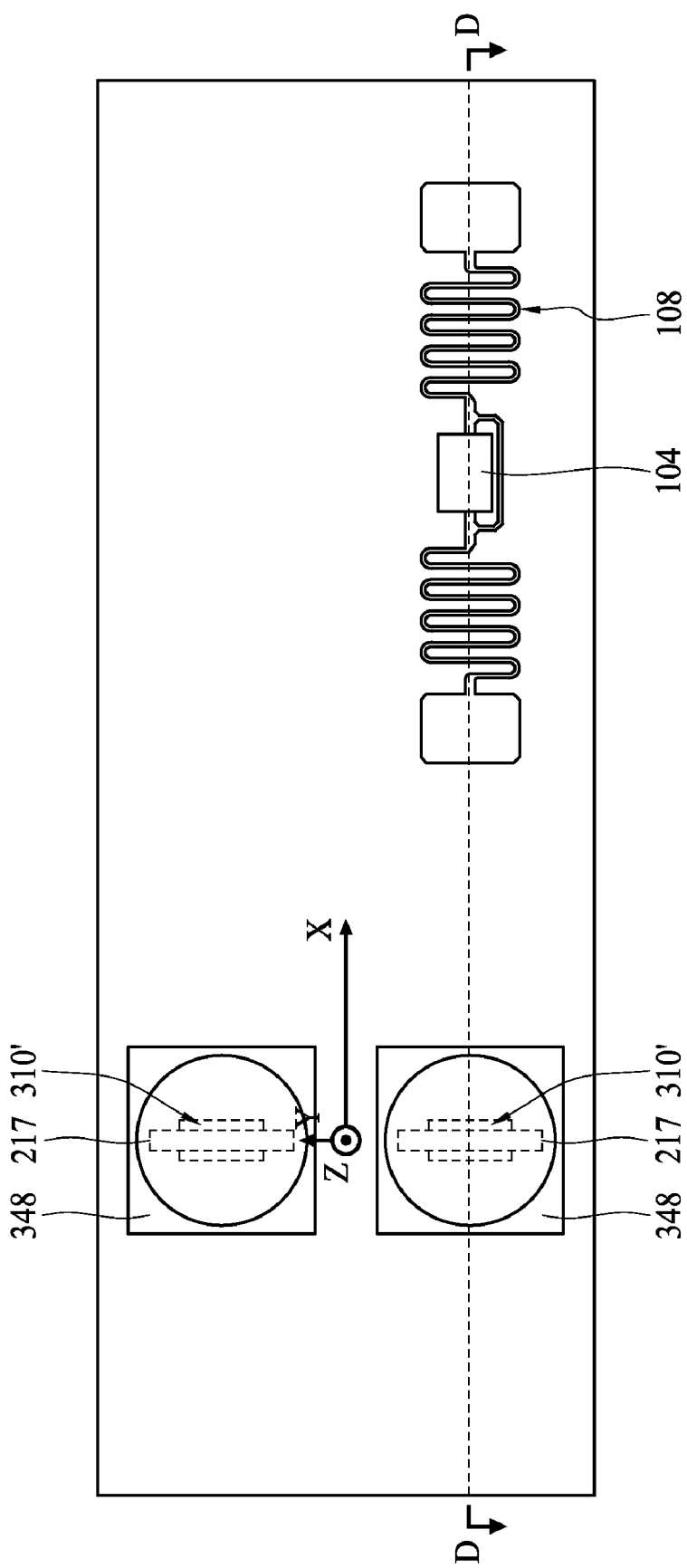
FIG. 13 is a top view showing an x-axis thermal bubble type angular accelerometer formed on a flexible substrate and having a rectangular cover with a hemi-spherical interior according to another embodiment of the present invention.
Figure 14:
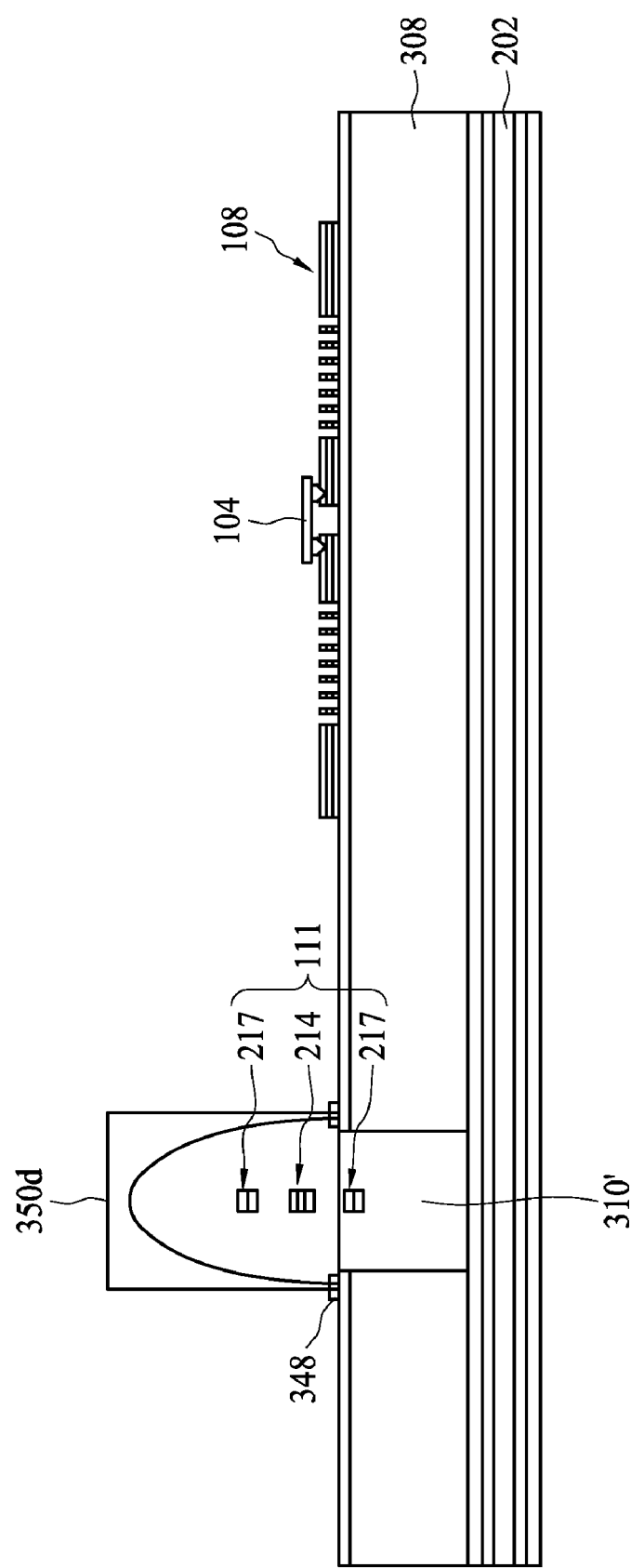
FIG. 14 is a cross-sectional view along line D-D of FIG. 13.

Referring to FIG. 13, in another embodiment, the sensing assembly 111 can be sealed with a cover 350d having a hemi-spherical interior, which may facilitate the temperature distribution and facilitate the sensing assembly 111 to quickly reach a steady state temperature without causing turbulent flow. FIG. 14 is a cross-sectional view along the DD line of FIG. 13 showing an RFID card integrated with an x-axis thermal bubble type angular accelerometer having a rectangular cover with a hemi-spherical interior according to one embodiment of the present invention. By the way FIG. 14 can also be applied for an x-axis thermal bubble type angular accelerometer having a rectangular cover with a hemi-cylindrical interior according to one embodiment of the present invention.

Figure 15:
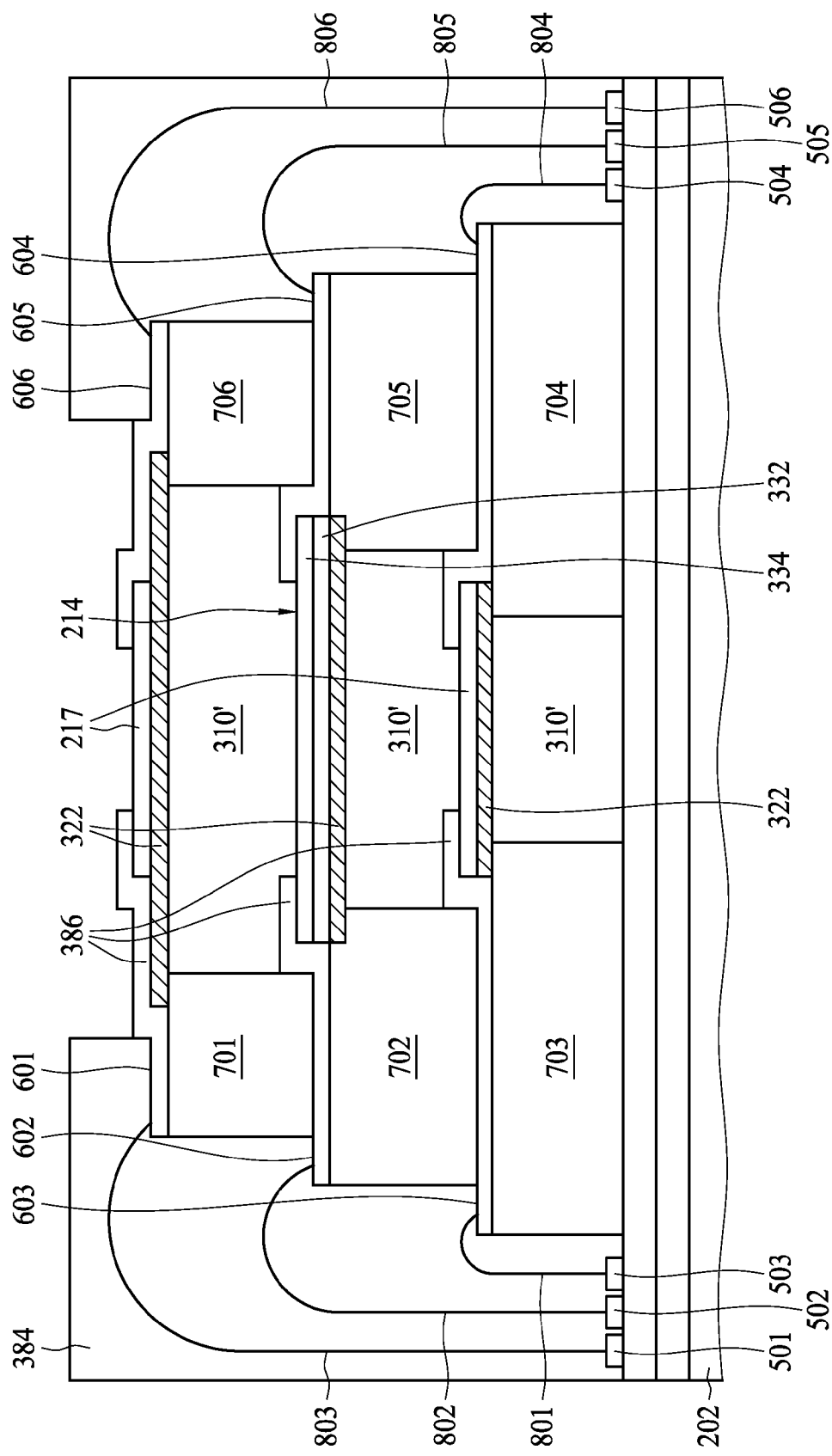
FIG. 15 is a cross-sectional view showing an x-axis thermal bubble type angular accelerometer including a heater and two temperature-sensing elements suspended over a cavity according to one embodiment of the present invention.

Referring to FIG. 15, in the embodiments of FIGS. 11 to 14, the heaters 214 and the temperature sensing elements 217 are arranged in a stacking manner. The method of manufacturing the stacked heaters 214 and temperature sensing elements 217 includes alternating formation of the chrome layer 332, the nickel layer 334, the support member 322, the silicon nitride layers 701 to 706 and the silicon dioxide sacrificial layers disposed between the heater 214 and the temperature-sensing elements 217, such that a vertically stacked sandwich structure is obtained, wherein each of the silicon nitride layers 701 to 706 surrounds the respective gas chamber cavity 310' and is configured as a support layer.

A plurality of solder pads 501 to 506 each including gold, nickel, and chrome layers can be formed around the gas chamber cavity 310' for wire bonding with gold wires 801 to 806 connecting the pads 602 and 605 of the heater 214 and the pads 601, 603, 604, and 606 of temperature-sensing elements 217 to the peripheral pads 501 to 506 as shown in FIG. 15. In order to reduce the wire loop heights of the gold wires 801 to 806 connecting the pads of the heater 214 and the temperature-sensing elements 217, gold wires are first bonded to the pads 501 to 506 on the substrate 202, and then bonded to the pads 601 to 606 of the heater 214 and the temperature-sensing elements 217 during the wire-bonding process. After the wire-bonding process is completed, adhesive 384 is applied to cover the gold wires 601 to 606 for protection. The silicon dioxide sacrificial layer is then removed using buffered HF solution or the plasma-etching process is performed using an etching gas, for example, $SF_6$, so that the heater 214, the upper and lower temperature-sensing elements 217, and the aluminum nitride support member 322 can be suspended over the cavity 310'.

Figure 16:
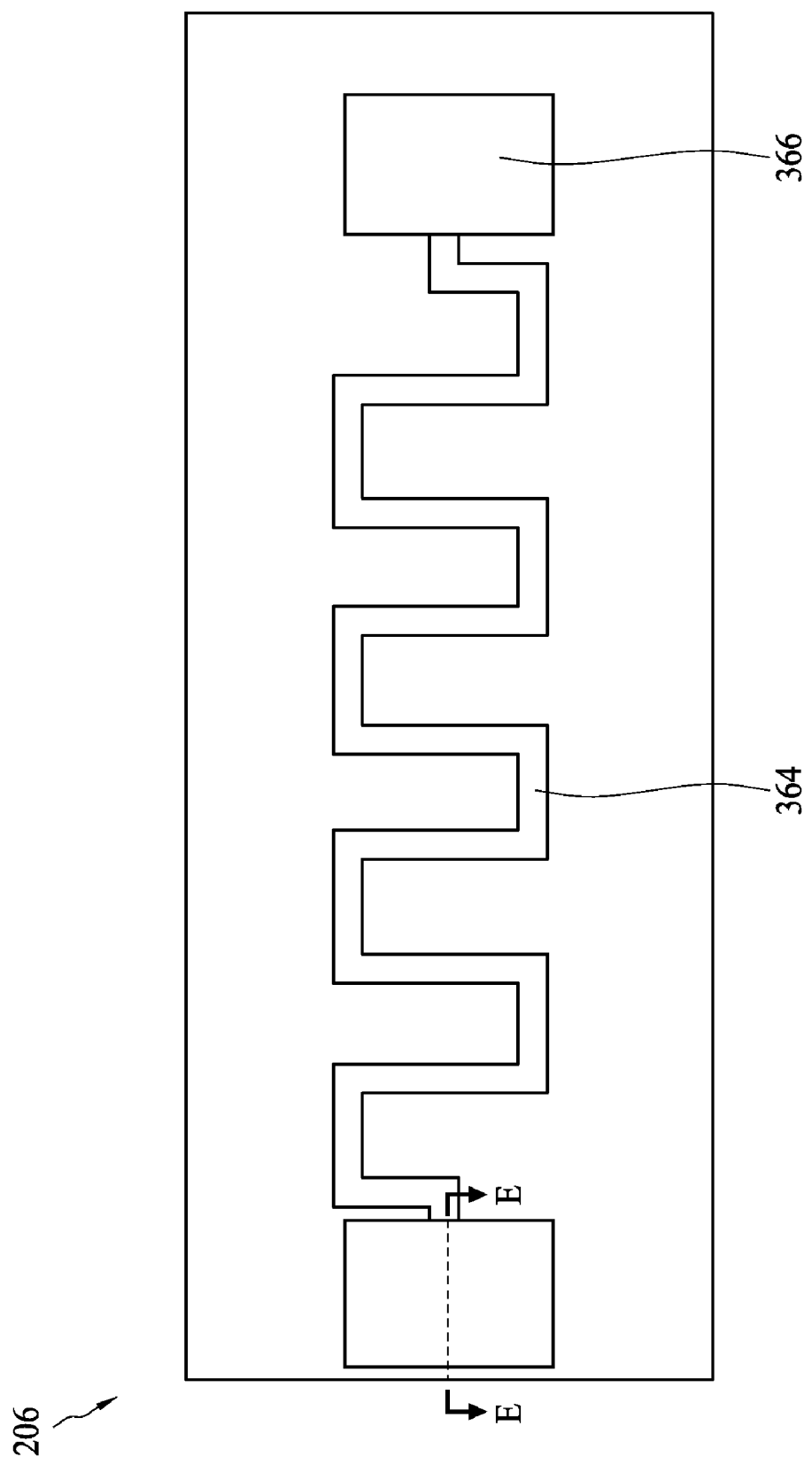
FIG. 16 is a top view showing a thin film resistor according to one embodiment of the present invention.
Figure 17:
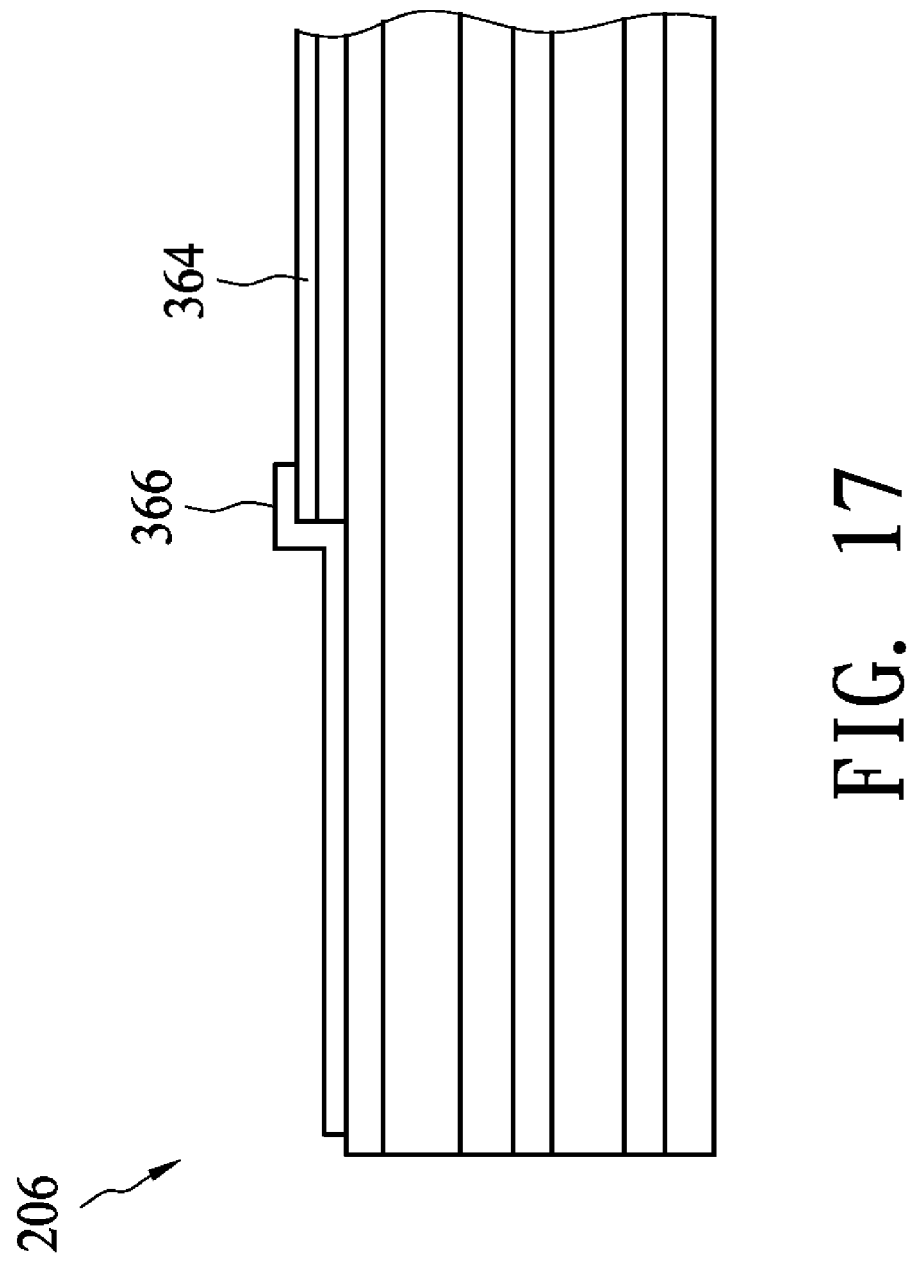
FIG. 17 is a cross-sectional view along line E-E of FIG. 16.

Referring to FIGS. 2, 16, and 17, the circuit 204 includes a plurality of thin film resistors 206. The thin film resistor 206 may include a curved portion 364 in zigzag form so that the thin film resistor 206 requires less substrate area. In one embodiment, the thin film resistor 206 may include a chrome layer and a nickel layer. In another embodiment, the thin film resistors 206 may include doped p-type poly-silicon. A thin film resistor 206 made of doped p-type poly-silicon can have a wider range of resistance. Therefore, the selection of the material of a thin film resistor 206 may depend on the required resistance of the thin film resistor 206 and the limitation of the available substrate area. After the curved portion 364 is completed, metal pads 366 are respectively formed on the end portions of the curved portion 364, and the manufacture of the thin film resistor 206 is finished after the metal pads 366 are completed.

Figure 18:
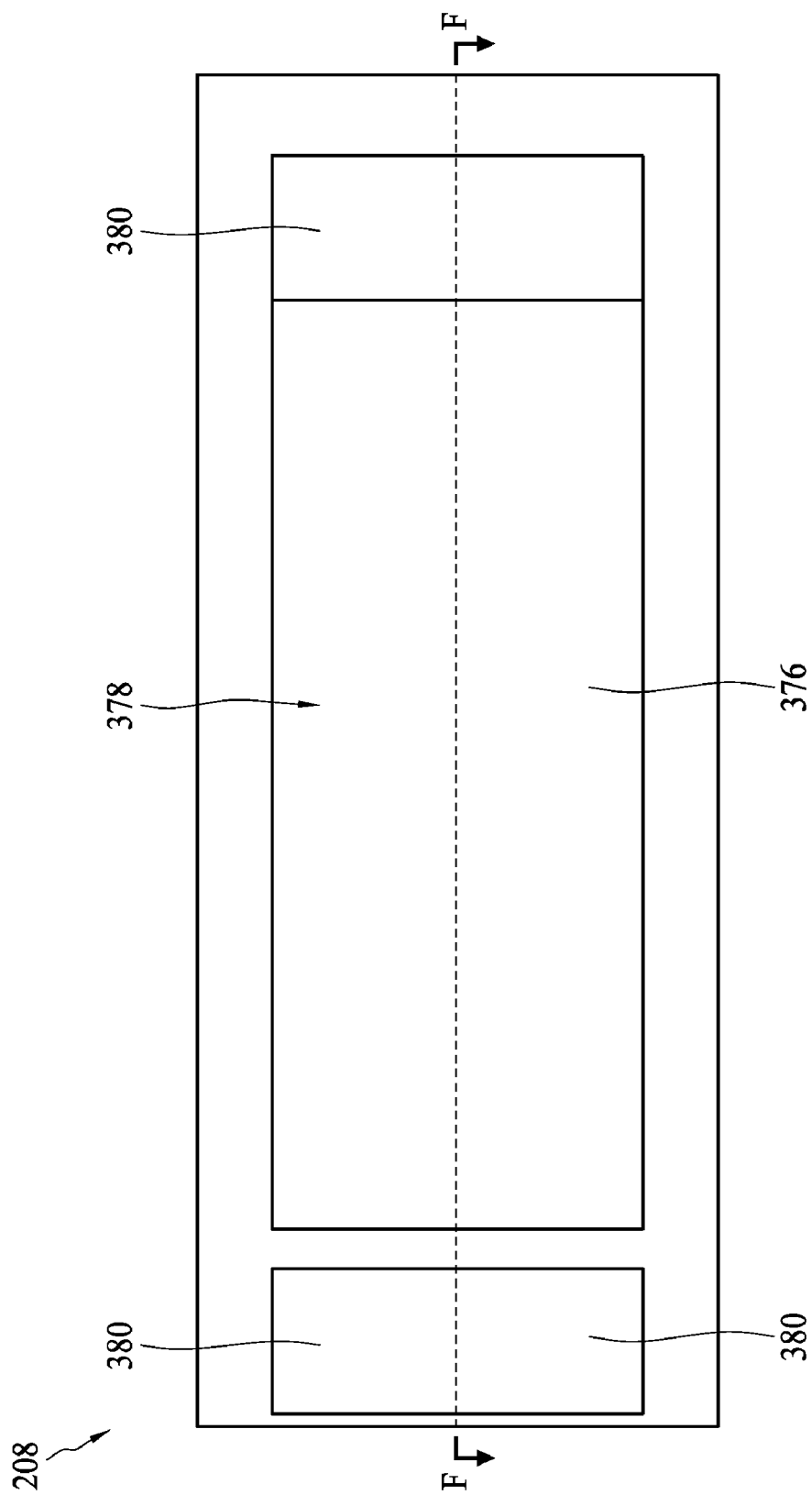
FIG. 18 is a top view showing a thin film capacitor according to one embodiment of the present invention.
Figure 19:
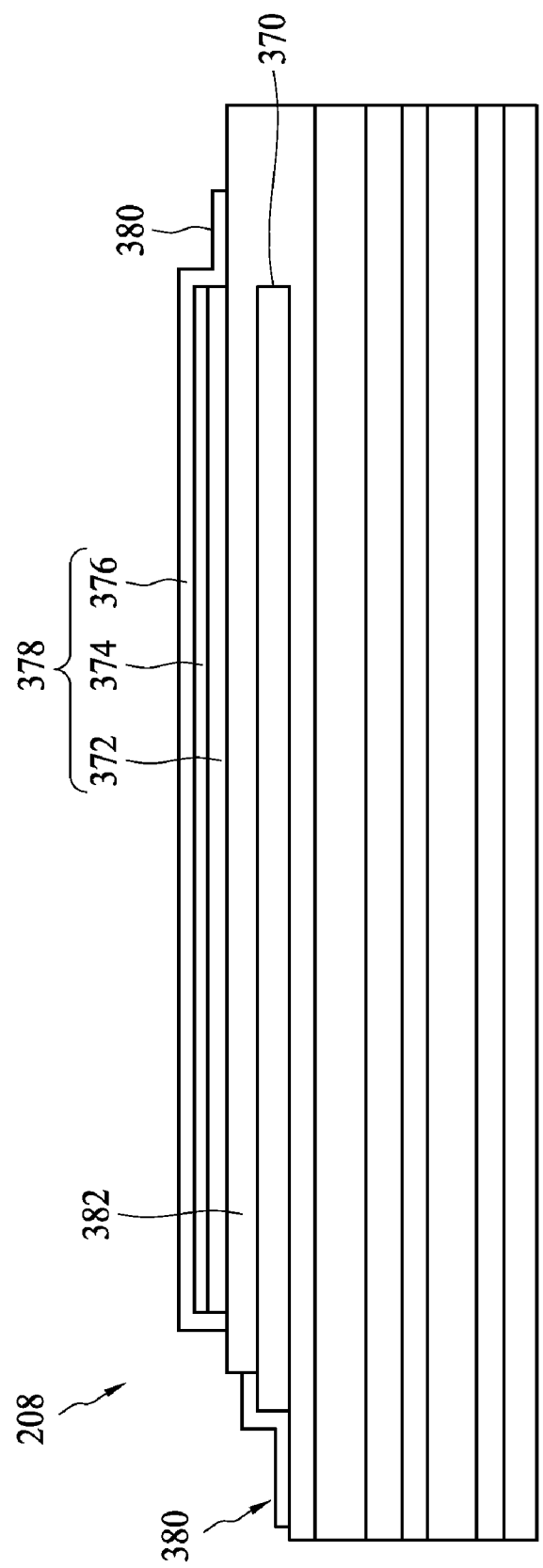
FIG. 19 is a cross-sectional view along line F-F of FIG. 18.

Referring to FIGS. 2, 18, and 19, the thin film resistor-capacitor module 208 may include a lower electrode 370 made of doped p-type poly-silicon and an upper electrode 378 including a chrome layer 372, a nickel layer 374, and a gold layer 376. Gold layers 380 connecting the upper and lower electrodes 370 and 378 are adopted for external electrical connection. A silicon nitride layer 382 or a layer made of high dielectric materials can be formed between the lower electrode 370 and the upper electrode 378 for electrical insulation. The thin film capacitor 208 can be coupled to the RFID antenna 108 for adjusting the resonant frequency and can also be configured for filtering power and signals.

In addition, the present invention has five aspects:

The first aspect is that the angular accelerometer is manufactured on a flexible substrate, not on a silicon substrate;

the second aspect is that an active RFID antenna is integrally formed on the flexible substrate;

the third aspect is that the material of a support member used for supporting heaters and temperature-sensing elements is aluminum nitride;

the fourth aspect is that the interior of a cover is hemi-cylindrical or hemi-spherical; and the fifth aspect is that the gas in the chamber of the angular accelerometer is a high molecular weight noble gas such as argon, krypton, and xenon.

With regard to the above first and third aspects, traditional capacitive accelerometers or thermal bubble type accelerometers are manufactured on silicon wafers, and use silicon dioxide support so that high temperature processes are required. Further, the traditional capacitive accelerometers or traditional thermal bubble accelerometers use silicon substrate having a thermal conductivity coefficient higher than that of the flexible substrate. The flexible substrate, which can be made of plastics such as PET (polyethylene terephthalate) or PI (polyimide), is adopted by the angular accelerometer of the present invention so that the angular accelerometer of the present invention may perform better in saving energy than the traditional accelerometers. The support members in the angular accelerometer of the present invention are made of aluminum nitride or silicon nitride, which has a thermal conductivity coefficient higher than that of silicon dioxide used for the support members in traditional accelerometers. Therefore, compared with the traditional accelerometers, the angular accelerometer of the present invention can use less electrical energy and have better sensitivity. In particular, the sealing cover may have a hemi-cylindrical or hemi-spherical interior such that the gas temperature may quickly be stabilized and cause no turbulent flow. Therefore, the response time, accuracy of angular acceleration measurement, linearity, and range of the measurement of the angular accelerometer can all be improved.

While for the fifth aspect, by using the high molecular weight noble gas, the sensitivity of the angular accelerometer can be increased, and the oxidation and aging of heaters and thermal resistors can be avoided. In comparison, traditional accelerometers contain air or volatile liquids, which may oxidize heaters and thermal resistors, causing deterioration and reduced performance and lifespan of the heaters and thermal resistors.

By the way the aforementioned RFID based thermal bubble type angular accelerometer can also be combined with the Bluetooth or zigbee wireless module on the flexible substrate for monitoring the angular acceleration. Although the above embodiments of the present invention only demonstrate using a RFID module with a thermal bubble type angular accelerometer, however Bluetooth or zigbee wireless module can be also applied in similar way. Therefore, the embodiments for Bluetooth or zigbee wireless module are omitted to avoid redundancy.

The above-described embodiments of the present invention are intended to be illustrative only. Numerous alternative embodiments may be devised by persons skilled in the art without departing from the scope of the following claims.

What is claimed is:

1. A thermal bubble type angular accelerometer, comprising:
    a flexible substrate;
    a base layer formed on the flexible substrate and including a surface;
    at least one first cavity formed on the surface; and at least one sensing assembly suspended over the at least one first cavity, the at least one sensing assembly comprising:
        a first heater; and
        two first temperature sensing elements disposed substantially symmetrically on opposite sides of the first heater, wherein the first heater and the two first temperature sensing elements extend in a radial manner.

2. The thermal bubble type angular accelerometer of claim 1, further comprising: a plurality of first cavities; and a plurality of first sensing assemblies disposed around a first axis perpendicular to the surface and equidistant from the first axis, the plurality of first sensing assemblies correspondingly suspended over the plurality of first cavities, wherein the first heater and the two first temperature sensing elements of each first sensing assembly extend radially relative to the first axis.

3. The thermal bubble type angular accelerometer of claim 2, further comprising: an embedded system-on-chip unit disposed on the flexible substrate, including a modulation/demodulation module; and an RFID antenna formed on the flexible substrate, coupled to the modulation/demodulation module; wherein the plurality of first sensing assemblies comprise two interconnected first sensing assemblies, and the first temperature sensing elements of the two interconnected first sensing assemblies are connected to form a first Wheatstone bridge circuit coupled to the embedded system-on-chip unit such that the embedded system-on-chip unit calculates a value of the angular acceleration about the first axis based on voltage difference across the first Wheatstone bridge circuit, and the value of the angular acceleration about the first axis is modulated and coded by the modulation/demodulation module and sent using the RFID antenna.

4. The thermal bubble type angular accelerometer of claim 3, further comprising:
    a plurality of second cavities formed on the surface and disposed on opposite sides of a second axis parallel to the surface; and
    a plurality of second sensing assemblies correspondingly suspended over the plurality of second cavities and disposed symmetrically relative to the second axis, each second sensing assembly comprising:
        a second heater; and
        two second temperature sensing elements, wherein the second heater and the two second temperature sensing elements are arranged along a direction parallel to the first axis, and the two second temperature sensing elements are disposed symmetrically relative to the second heater; wherein the plurality of second sensing assemblies comprise two oppositely disposed second sensing assemblies and the second temperature sensing elements of the two oppositely disposed second sensing assemblies are connected to form a second Wheatstone bridge circuit coupled to the embedded system-on-chip unit such that the embedded system-on-chip unit calculates a value of the angular acceleration about the second axis based on voltage difference across the second Wheatstone bridge circuit, and the value of the angular acceleration about the second axis is modulated and coded by the modulation/demodulation module and sent using the RFID antenna.

5. The thermal bubble type angular accelerometer of claim 4, wherein the second heater and the two second temperature sensing elements extend substantially perpendicular to the second axis.

6. The thermal bubble type angular accelerometer of claim 4, further comprising:
    a plurality of third cavities formed on the surface of, and disposed on opposite sides of, a third axis parallel to the surface, wherein the third axis is perpendicular to the first and the second axis; and
    a plurality of third sensing assemblies correspondingly suspended over the plurality of third cavities and disposed symmetrically relative to the third axis, each third sensing assembly comprising:
        a third heater; and
        two third temperature sensing elements, wherein the third heater and the two third temperature sensing elements are arranged along a direction parallel to the first axis, and the two third temperature sensing elements are disposed symmetrically relative to the third heater; wherein the plurality of third sensing assemblies comprises two oppositely disposed third sensing assemblies and the third temperature sensing elements of the two oppositely disposed third sensing assemblies are connected to form a third Wheatstone bridge circuit coupled to the embedded system-on-chip unit such that the embedded system-on-chip unit calculates a value of the angular acceleration about the third axis based on voltage difference across the third Wheatstone bridge circuit, and the value of the angular acceleration about the third axis is modulated and coded by the modulation/demodulation module and sent using the RFID antenna.

7. The thermal bubble type angular accelerometer of claim 6, wherein the third heater and the two third temperature sensing elements extend substantially perpendicular to the third axis.

8. The thermal bubble type angular accelerometer of claim 6, wherein the RFID antenna comprises a chrome layer, a nickel layer, and a gold layer, wherein the gold layer is formed on the chrome layer and nickel layer using an electroless plating process.

9. The thermal bubble type angular accelerometer of claim 6, wherein the first, second, and third heaters comprise nickel and chrome.

10. The thermal bubble type angular accelerometer of claim 6, further comprising a high molecular weight noble gas and a plurality of covers disposed to cover the plurality of first, second, and third cavities to seal the high molecular weight noble gas within the first, second, and third second cavities, respectively.

11. The thermal bubble type angular accelerometer of claim 10, wherein the high molecular weight noble gas is argon, krypton, or xenon.

12. The thermal bubble type angular accelerometer of claim 6, further comprising a plurality of support members each disposed below the respective one of the first heaters, the first temperature sensing elements, the second heaters, the second temperature sensing elements, the third heaters, and the third temperature sensing elements, the support members spanning over respective one of the first, second and third cavities.

13. The thermal bubble type angular accelerometer of claim 12, wherein the material of the support member is aluminum nitride or silicon nitride.

14. The thermal bubble type angular accelerometer of claim 6, wherein each of the first, second, and third temperature-sensing elements comprises doped p-type poly-silicon formed by E-beam evaporation and laser annealing.

15. The thermal bubble type angular accelerometer of claim 6, further comprising an oscillating module formed on the flexible substrate and coupled to the embedded system-on-chip unit for provision of a clock signal to the embedded system-on-chip unit, wherein the embedded system-on-chip unit is connected with at least one first thin film resistor and at least one thin film capacitor.

16. The thermal bubble type angular accelerometer of claim 15, further comprising a second thin film resistor, wherein the embedded system-on-chip unit further comprises an amplifying module coupled to the second thin film resistor.

17. The thermal bubble type angular accelerometer of claim 16, wherein the at least one thin film capacitor comprises a lower electrode, an upper electrode, and a dielectric layer disposed between the lower electrode and the upper electrode, wherein the at least one first thin film resistor and the second thin film resistor are made of doped p-type poly-silicon, and the upper electrode comprises a chrome layer, a nickel layer, and a gold layer.

18. The thermal bubble type angular accelerometer of claim 16, wherein the amplifying module comprises a plurality of instrumentation amplifiers.

19. The thermal bubble type angular accelerometer of claim 6, further comprising a rectifying module electrically coupled to the RFID antenna and configured to produce direct current using a radio-frequency signal.

20. The thermal bubble type angular accelerometer of claim 1, wherein the material of the flexible substrate is polyethylene terephthalate or polyimide.

21. The thermal bubble type angular accelerometer of claim 1, wherein the base layer includes a photoresist layer.

22. The thermal bubble type angular accelerometer of claim 1, further in combination with a wireless module on the flexible substrate for monitoring the angular acceleration, wherein the wireless module using BLUETOOTH or ZIGBEE communication protocol.

* * * * *